United States Patent [19]

Brisk

[11] 3,965,388

[45] June 22, 1976

[54] DIGITAL LIGHT RESPONSIVE SWITCHING CIRCUIT

[75] Inventor: Richard A. Brisk, Arlington, Mass.

[73] Assignee: Arthur D. Little, Inc., Cambridge, Mass.

[22] Filed: Dec. 13, 1974

[21] Appl. No.: 532,594

[52] U.S. Cl. .......................... 315/155; 307/235 F; 307/235 T
[51] Int. Cl.² .................................... H05B 39/04
[58] Field of Search ............... 315/155; 307/235 F, 307/235 T, 311

[56] References Cited
UNITED STATES PATENTS

| | | | |
|---|---|---|---|
| 3,569,739 | 3/1971 | Stolman | 307/235 T |
| 3,790,848 | 2/1974 | Lai | 315/155 |

Primary Examiner—James B. Mullins
Assistant Examiner—Darwin R. Hostetter
Attorney, Agent, or Firm—Weingarten, Maxham & Schurgin

[57] ABSTRACT

A digital light responsive switching circuit in which a plurality of photosensors are respectively responsive to different sources of illumination and in which the electrical input channels are independent and each operative to provide digital output signals representative of sensed illumination levels.

8 Claims, 2 Drawing Figures

# DIGITAL LIGHT RESPONSIVE SWITCHING CIRCUIT

FIELD OF THE INVENTION

This invention relates to light responsive electronic circuits and more particularly to switching circuits having multiple photosensors responsive to respective illumination sources.

BACKGROUND OF THE INVENTION

It is often useful to control an electronic switching circuit in response to different illumination sources; for example, a circuit operative only at night or under reduced ambient light conditions to turn on utilization apparatus in response to an incident light beam. Such circuits are generally known and include a plurality of photosensors each responsive to a respective source of illumination and which are selectively energized in an intended manner to actuate a switching device. Such known circuits are shown, for example, in U.S. Pat. Nos. 1,721,216; 3,083,300; 3,601,614; 3,089,065 and 3,160,757.

In circuits of known construction, the plural photosensors are coupled by analog circuitry to a switching device such as a transistor or other solid state switch, and these photosensors are interdependent such that a variation in the response of one sensor can affect the response of the other ones. As a result, it is often difficult to provide the desired degree of sensitivity or control.

SUMMARY OF THE INVENTION

In accordance with the present invention, a light responsive switching circuit is provided in which the photosensors are cooperative with electrical input channels independent from each other and which are each responsive only to a respective source of illumination incident thereon. Each input channel includes a reference or threshold source and provides a digital output signal of one signal level in response to incident light greater than the reference level and of another signal level in response to incident light less than the reference level. Each digital output signal is applied as an input to control logic operative to produce an output signal only in response to selected input signal conditions for operation of an associated switching device or other utilization apparatus. The circuit is readily implemented in modular microcircuit form adapted for connection to a variety of utilization devices and systems without any change in the circuit module itself.

The novel switching circuit is especially useful in highway or construction markers wherein a warning light can be actuated in response to illumination from headlights of an approaching vehicle. In such application, the output of the control logic is coupled to a lamp circuit for providing a visual output indication responsive to a sensed approaching vehicle.

DESCRIPTION OF THE DRAWINGS

The invention will be more fully understood from the following detailed description taken in conjunction with the accompanying drawings in which.

DETAILED DESCRIPTION OF THE INVENTION

The invention will be described in an embodiment for use in a highway barrier or marker in which a warning flash is instituted in response to light from an approaching vehicle headlight when the ambient light level is less than a selected thresold level. It will be appreciated that the invention is equally useful in a variety of applications in which a plurality of photosensors are respectively responsive to different illumination sources.

Figure 1:
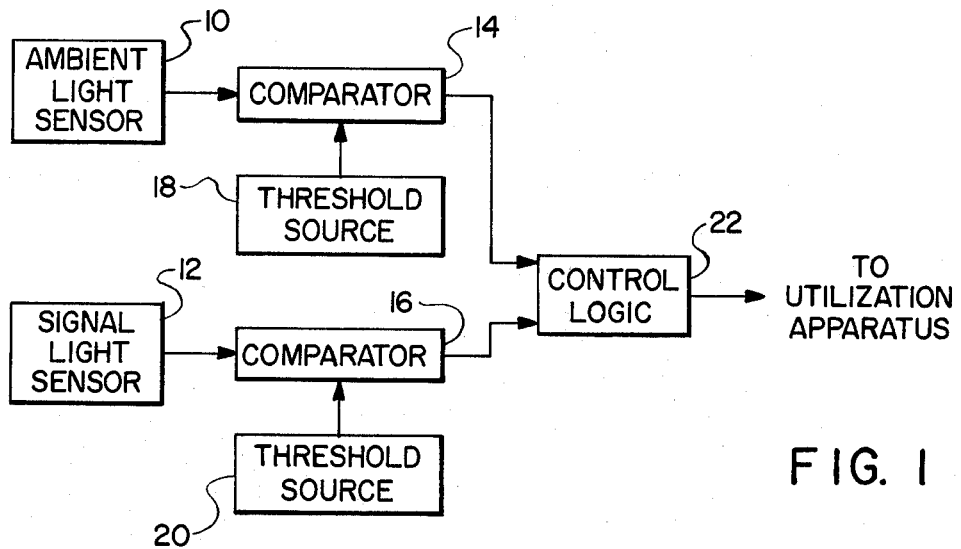
FIG. 1 is a block diagram representation of a preferred embodiment of the invention.

Referring to FIG. 1, there is shown first and second photosensors 10 and 12 each coupled to a respective comparator circuit 14 and 16 and each of which also receives a reference signal from respective threshold sources 18 and 20. The output from each comparator 14 and 16 is coupled to control logic 22 which provides an output signal in accordance with predetermined light conditions as sensed by photosensors 10 and 12. Each of the comparators 14 and 16 has a reference level determined in accordance with the reference signal from sources 18 and 20 and each is operative to provide an output signal of one amplitude level in response to a received photosensor signal below the selected threshold level and an output signal of a second amplitude level in response to a photosensor signal at least equal to the threshold level. Thus, the comparators provide digital output signals having binary signal levels in accordance with input signal conditions as provided by the photosensors 10 and 12 which, in turn, are responsive to predetermined received light intensities.

The provision of digital signals for subsequent processing by control logic 22 offers particular advantages in the practice of the invention. An output signal from the comparators is provided only if a photosensor signal is equal to or greater than the corresponding comparator threshold level thereby to enhance the likelihood that a valid photosensor output signal is present. Each photosensor is directly connected to a respective digital comparator and is electrically distinct from the channel associated with the other photosensor. Thus, the response of each photosensor can be selected in accordance with the intended light conditions to be detected by that sensor and processed accordingly without affecting the requirements or adjustments of the other photosensor channel.

The control logic 22 is operative to provide an output signal in response to predetermined input signal conditions suitable for the particular application. For example, for use in a highway marker, the control logic provides an output signal in response to signal light received by sensor 12 of at least a selected minimum intensity. In the embodiment of FIG. 1, each sensor 10 and 12 can provide an output signal which varies in direct correspondence with the intensity of received light. The associated comparators 14 and 16 will provide intended output signals only when the input signals are in proper relationship to the corresponding threshold levels. Comparator 14 provides an appropriate output signal when a signal received from ambient light sensor 10 is less than the threshold level determined by source 18. Comparator 16 provides an appropriate output signal in response to an input signal from signal light sensor 12 which is at least equal to the threshold level determined by source 20. The comparator output signals are preferably of binary form having one binary value in response to an appropriate input signal to the comparator, and of opposite binary value in the absence of an appropriate input signal. The control logic 22 is operative in response to the signals applied thereto from the comparators which are of selected binary significance to produce an intended input signal condition to cause the provision by logic 22 of an output signal for control of the utilization apparatus.

Figure 2:
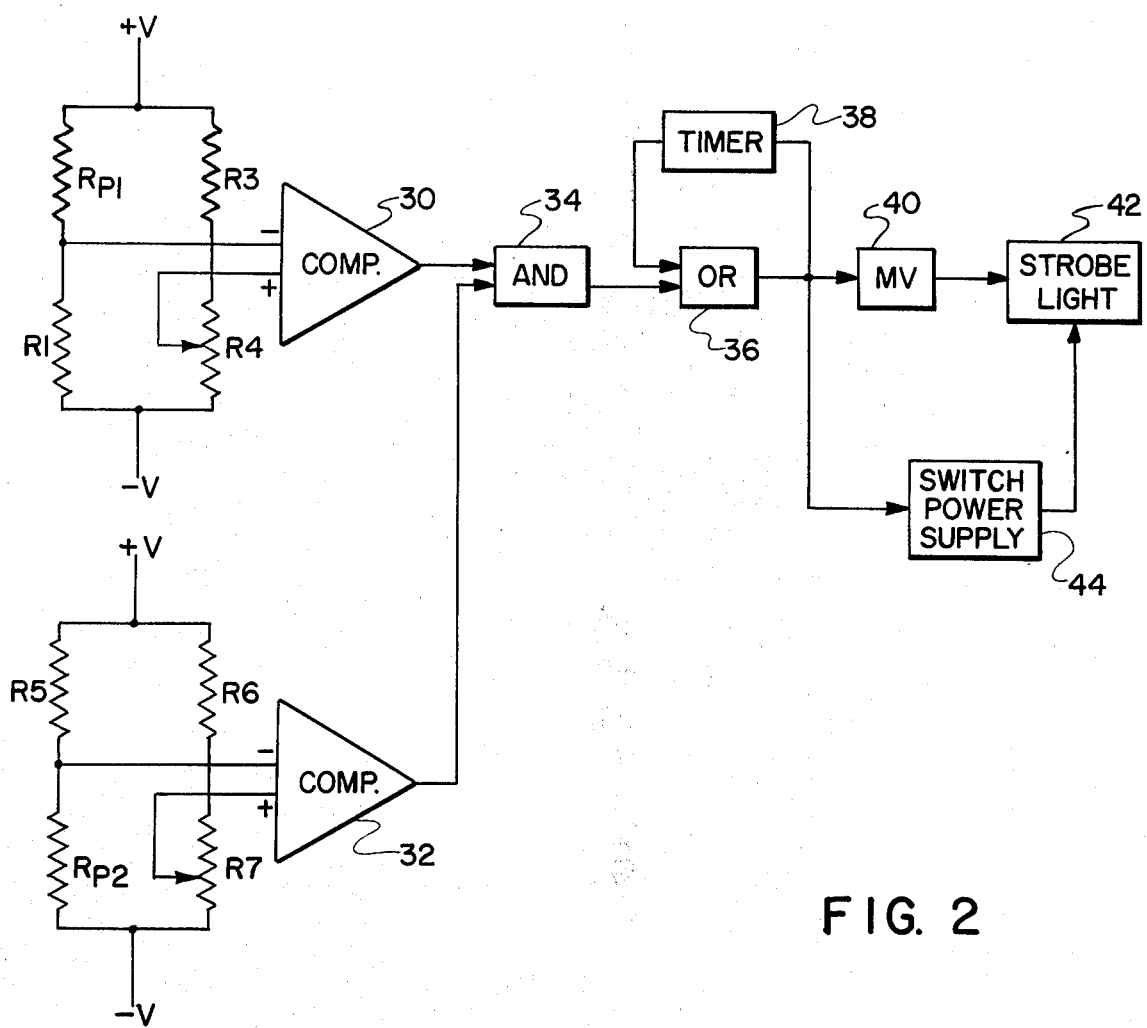
FIG. 2 is a block diagram representation of an alternative embodiment of the invention.

The circuit of the invention is shown more particularly in FIG. 2. A photoresistor $R_{p1}$ is connected to a source of positive potential +V and to one terminal of a resistor R1, the other terminal of which is connected to a source of negative potential −V. Serially connected resistor R3 and potentiometer R4 are also connected between the positive and negative voltage sources. The junction of photoresistor $R_{p1}$ and resistor R1 is coupled to the negative input of a comparator 30, while the positive input of the comparator is coupled to the movable contact of potentiometer R4. The photoresistor $R_{p1}$ serves as an ambient light sensor, while the voltage divider defined by resistors R3 and R4 provides the threshold voltage for comparator 30 and with respect to which a comparator output signal is provided. The threshold voltage is adjustable by means of potentiometer R4.

A second network similar to that just described includes a photoresistor $R_{p2}$ connected to a source of negative potential −V and to one terminal of a resistor R5, the other terminal of which is connected to a source of positive potential +V. A voltage divider including serially connected potentiometer R7 and resistor R6 is connected between the voltage sources. The junction of photosensor $R_{p2}$ and resistor R5 is connected to the negative input of a comparator 32, the positive input of which is connected to the movable contact of potentiometer R7. The photoresistor $R_{p2}$ senses illumination from the headlights of an approaching vehicle, the voltage divider provided by resistors R6 and R7 determining the threshold level for comparator 32. This threshold is adjustable by potentiometer R7.

An output signal is provided to the negative input of each comparator 30 and 32 in response to light of predetermined magnitude received by the respective photoresistors. The interconnection of sensor $R_{p2}$ is of opposite sense to that of sensor $R_{p1}$ such that the sensor $R_{p1}$ provides an output of increasing voltage with decreasing light levels, while sensor $R_{p2}$ provides an output of decreasing voltage with decreasing light levels. Thus, the sensor $R_{p1}$, which is responsive to ambient light, provides an output signal above the threshold level determined by resistors R3 and R4 at a predetermined low level of ambient illumination, thereby causing provision of an appropriate digital output signal by comparator 30. The sensor $R_{p2}$ is responsive to the illumination from an approaching vehicle headlight, in the illustrated embodiment, and provides an output signal greater than a threshold level determined by resistors R6 and R7 at predetermined higher levels of illumination to cause provision of an intended digital output signal by comparator 32. A comparator output signal of appropriate binary level is provided in each channel only when the light incident upon the corresponding photosensor is of proper intensity with respect to the associated threshold level. Each photosensor channel is thus electrically distinct, with each channel being individually adjustable with respect to its threshold level without material affect on the other photosensor channel.

The digital output signals from comparators 30 and 32 are applied to respective inputs of an AND gate 34.

The AND gate 34 provides an output signal to one input of an OR gate 36, which also receives a signal from a timer circuit 38. The output of OR gate 36 is applied to timer circuit 38, a multivibrator 40 and a switching power supply 44. The multivibrator and switching power supply provide output signals for a strobe light circuit 42.

An output signal from OR gate 36 causes timer circuit 38 to provide a timing gate signal which serves as a second input to the OR gate. The timer circuit 38 can be constructed to be triggered on the leading edge or the trailing edge of the OR gate output signal. If the timer circuit 38 is triggered on the leading edge of the OR gate output signal, a gate signal is provided of predetermined duration which will define the minimum duration of the output signal from OR gate 36. If the timer circuit 38 is triggered on the trailing edge of the OR gate output signal, a gate signal of predetermined duration will be provided to cause provision of an OR gate output signal of minimum duration after termination of the signal from AND gate 34. The timer circuit thus assures a minimum time interval in which an output signal is provided by OR gate 36 for driving utilization apparatus such as the strobe light circuit 42.

The utilization apparatus in the illustrated embodiment is a strobe light operative to provide a burst of illumination in response to proper input light conditions seen by the photosensors. The strobe light circuitry includes a multivibrator 40 providing trigger pulses to the triggering electrode of the strobe lamp of circuit 42, and switching power supply 44 which provides output pulses to the anode of the strobe lamp of circuit 42. The trigger pulses from multivibrator 40 determine the flash rate of the strobe lamp, while the intended anode voltage is determined by switching power supply 44.

In operation, the threshold voltage level determined by the voltage divider comprised of resistors R3 and R4 specifies the ambient light threshold, while the signal light threshold is defined by the threshold voltage level of the voltage divider comprised of resistors R6 and R7. Ambient light received by photosensor $R_{p1}$ of predetermined lower levels of intensity will cause production of a photosensor signal above the ambient light threshold and thereby cause comparator 30 to provide a digital output signal representing an intended ambient light condition. Signal light such as from a vehicle headlight of at least predetermined minimum intensity received by photosensor $R_{p2}$ will cause a photosensor signal above the signal light threshold to thereby cause a digital output signal from comparator 32 representing an intended signal light condition. It will be appreciated that each comparator 30 and 32 provides a respective intended digital output signal only in response to light intensity sensed by the associated photosensor and meeting the predetermined relationship to the respective threshold criteria, and without regard to light received by the photosensor of the other channel. The presence of both comparator output signals of intended binary value at the inputs of AND gate 34 cause an output signal from the AND gate and thence from OR gate 36 for actuation of the strobe light circuitry or other utilization apparatus.

A particular feature of the invention is the provision of electrically distinct signal channels associated with each photosensor such that each sensor is responsive only to light received by it. Adjustment and calibration of each signal channel can be independently achieved without interaction of associated channels. Moreover, the invention provides digital output signals of appropriate value only in response to predetermined input light conditions. There is thus less likelihood of providing an erroneous output signal in response to spurious input light conditions. The circuitry of the invention is typically implemented in modular microcircuit form which can be readily installed in a variety of utilization devices and systems. Each photosensor of the novel circuit is housed in a manner to receive light essentially from only the intended light source, and such housing may include in various embodiments appropriate optical elements as suitable for the purpose.

It will be appreciated that the invention is not limited to use with only a two channel system, as for certain purposes it may be desirable to provide a greater plurality of channels each with its distinctly controllable photosensor. Accordingly, the invention is not to be limited by what has been particularly shown and described, except as indicated in the appended claims.

What is claimed is:

1. A digital light responsive switching circuit comprising:
   at least first and second electrically isolated photosensors each responsive to a respective light source, at least one being responsive to ambient light and the other being responsive to a signal light;
   at least first and second comparator circuits each having a threshold level representing respective input light conditions and coupled to a respective one of said photosensors each operative to provide a digital output signal of one signal level in response to incident light greater than said threshold level and of another signal level in response to incident light less than said threshold level; and
   control logic operative in response to said digital output signals from said comparator circuits to provide an intended output signal only in response to selected ambient and signal light conditions represented by said received digital output signals, said control logic output signal adapted for energization of utilization apparatus.

2. A digital light responsive switching circuit comprising:
   a first photosensor disposed to receive light from an ambient source;
   a second photosensor electrically isolated from said first photosensor and disposed to receive light from a signal source;
   first and second comparator circuits each having a respective threshold level and coupled to a respective one of said photosensors and providing a digital output signal of one signal level in response to incident light on the corresponding photosensor at least equal to said threshold level and of another signal level in response to incident light on said corresponding photosensor less than said threshold level; and
   gate means operative in response to said digital output signals to provide an output signal only in response to selected ambient and signal light conditions represented by said digital output signals.

3. The circuit according to claim 2 wherein said first and second photosensors each include
   a photoresistor disposed to receive light from a respective source; and
   circuit means for energizing said photoresistor;
   and wherein the threshold level for each of said comparator circuits includes a voltage divider coupled to and energized by said circuit means.

4. The circuit according to claim 2 further including means for providing an output indication in response to predetermined ambient and signal light conditions, said means being coupled to said gate means and operative in response to said gate means output signals.

5. A digital light responsive switching circuit comprising:
   at least first and second photosensing networks each responsive to a respective ambient light source and signal light source and each including
      a source of positive potential;
      a source of negative potential;
      photoresistor means connected between said sources of positive and negative potential;
      terminal means connected to said photoresistor means at which a signal is provided in response to light received by said photoresistor means;
      a voltage divider connected between said sources of positive and negative potential and including a potentiometer for adjusting the output voltage thereof, said voltage divider output voltage being selected to provide a predetermined threshold level;
   at least first and second comparator circuits each coupled to a respective one of said photosensing networks and each operative to provide a digital output signal of one signal level in response to incident light on the corresponding photosensor greater than said threshold level and of another signal level in response to incident light on the corresponding photosensor less than said threshold level; and
   control logic operative in response to said digital output signals to provide an output signal for energization of utilization apparatus only in response to said digital output signals representing received ambient light less than the corresponding threshold level and received signal light greater than the corresponding threshold level.

6. The circuit according to claim 5 wherein said control logic includes
   an AND gate operative to provide an output signal in response to the coincident receipt of digital output signals of predetermined signal level from said comparator circuits;
   an OR gate operative in response to the output signal from said AND gate to provide an output signal for energization of utilization apparatus; and
   a timer circuit providing a timer signal to said OR gate in response to an OR gate output signal such that said OR gate output signal is of a predetermined minimum duration determined by the duration of said timer signal.

7. The circuit according to claim 6 further including
   a strobe light circuit for providing a burst of illumination in response to predetermined input light conditions sensed by said photosensors;
   a multivibrator operative in response to said OR gate output signal to provide triggering pulses to the triggering electrode of the strobe lamp of said strobe light circuit; and
   a switching power supply operative in response to said OR gate output signal to provide pulses to the anode of the strobe lamp of said strobe light circuit.

8. The circuit according to claim 7 wherein said photoresistor means of at least one of said photosensing networks is oppositely connected between said sources of positive and negative potential with respect to another of said photoresistor means;

whereby one of said photoresistor means provides an output voltage of increasing magnitude with increasing incident light thereon while the other photoresistor means provides an output voltage of increasing magnitude with decreasing incident light thereon.

* * * * *